(12) United States Patent
Lai et al.

(10) Patent No.: US 7,414,559 B2
(45) Date of Patent: *Aug. 19, 2008

(54) DYNAMIC BIAS CIRCUIT

(75) Inventors: Tin Lai, San Jose, CA (US); Wilson Wong, San Francisco, CA (US); Sergey Yurevich Shumarayev, San Leandro, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/735,113

(22) Filed: Apr. 13, 2007

(65) Prior Publication Data

US 2007/0188353 A1      Aug. 16, 2007

Related U.S. Application Data

(63) Continuation of application No. 11/355,678, filed on Feb. 15, 2006, now Pat. No. 7,324,031.

(51) Int. Cl.
*H03M 1/66* (2006.01)
(52) U.S. Cl. ............... 341/144; 341/118; 341/121; 341/141
(58) Field of Classification Search ............. 341/120, 341/121, 118
See application file for complete search history.

(56) References Cited

U.S. PATENT DOCUMENTS

2005/0225517 A1* 10/2005 Sun .................... 345/76
2006/0132420 A1* 6/2006 Yoshida et al. ........ 345/98

* cited by examiner

*Primary Examiner*—Khai M Nguyen
(74) *Attorney, Agent, or Firm*—Martine Penilla & Gencarella, LLP

(57) ABSTRACT

A bias circuit includes a digital to analog converter (D2A) generating an output representing a voltage level for tuning an analog signal. The D2A is coupled to a primary register frame that is one of a plurality of register frames forming a data chain. The plurality of register frames are serially linked and data within the data chain is shifted among the plurality of register frames. Through a time domain multiplexing scheme, the D2A can be shared by control knobs of the equalization circuit. The bias circuit includes a decoder also coupled to the primary register frame. An output enable logic module is also included. The output enable logic module determines when the primary register has a complete data set as the data within the data chain is shifting according to the clock period. A method for adjusting a signal through a bias circuit is also provided.

19 Claims, 6 Drawing Sheets

DYNAMIC BIAS CIRCUIT

CROSS-REFERENCE TO RELATED APPLICATION

This application is a continuation application based on U.S. patent application Ser. No. 11/355,678 filed Feb. 15, 2006 now U.S. Pat. No. 7,324,031 which is herein incorporated by reference in its entirety for all purposes.

BACKGROUND

This application relates to integrated circuits and more particularly, to a dynamic bias circuit that is flexible, occupies a relatively small footprint, and can be adjusted to compensate for external variables.

Typical bias circuits suffer from a lack of capability of being fine-tuned or adjustable. In particular, these bias circuits may suffer from variations in temperature, supply voltages, and/or other process variations due to this lack of adjustability. That is, when any of these variations occur, the current bias circuits are unable to react to the changes as the output of the bias circuit is locked. One other shortcoming of current bias circuits is the relatively large footprint required for the circuit.

As a result, there is a need to solve the problems of the prior art to provide a bias circuit having a relatively small footprint and capable of being adjusted in response to any changing conditions that may affect the operation of the bias circuit or the signal the bias circuit may be adjusting.

SUMMARY

Broadly speaking, the present invention fills these needs by providing a dynamic bias circuit taking advantage of a single digital to analog converter. It should be appreciated that the present invention can be implemented in numerous ways, including as a method, a system, or an apparatus. Several inventive embodiments of the present invention are described below.

In one aspect of the invention, the bias circuit includes a digital to analog converter generating an output representing a voltage level for tuning an analog signal. The digital to analog converter is coupled to a primary register frame that is one of a plurality of register frames forming a data chain. The plurality of register frames are serially linked and data within the data chain is shifted among the plurality of register frames. Through a time domain-multiplexing scheme, the digital to analog converter can be shared by control knobs of the equalization circuit. The bias circuit includes a decoder also coupled to the primary register frame. The decoder selects one of a plurality of transmission gates that receive output from the digital to analog converter. An output enable logic module is also included. The output enable logic module determines when the primary register has a complete data set as the data within the data chain is shifting according to the clock period. The output enable logic module will assert an enable signal when the primary register has a complete data set therein. In one embodiment, the bias circuit is incorporated into a high-speed serial interface of a programmable logic device.

In another aspect of the invention, a method for adjusting multiple control knobs of an equalization circuit through a single digital to analog converter is provided. A plurality of register frames serially linked to form a data chain is provided and each of the plurality of register frames has a bit sequence stored therein. The method includes identifying when one of the plurality of register frames has a complete bit sequence since the data within the data chain is shifting according to a clock period. Once the complete bit sequence is within the data chain, a first portion of the complete bit sequence is converted to a value representing an analog voltage. Contemporaneously with the converting of the first portion, a second portion of the complete bit sequence is decoded to activate a transmission gate corresponding to one of the multiple control knobs of the equalization circuit. The decoded signal and an enable signal triggered when the complete bit sequence is within the data chain are gated so that a particular transmission gate is activated and the corresponding control knob can be adjusted.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

An invention is described for a dynamic bias circuit. It will be obvious, however, to one skilled in the art, that the present invention may be practiced without some or all of these specific details. In other instances, well known process operations have not been described in detail in order not to unnecessarily obscure the present invention.

The embodiments described herein include a dynamic bias circuit that consists of one n-bit digital to analog block, which provides one analog output with two resolutions between two referenced voltage levels. Here, n can be any integer equal to two or greater than two. The embodiments described below obtain X number of analog outputs through a single digital to analog converter, instead of using one digital-to-analog block for each output. Therefore, X number of n-bit registers, combined with a single digital to analog converter block can be utilized through time domain multiplexing, which is described in more detail below. In addition, the dynamic bias circuit described herein is temperature invariant, as well as tolerant to other external conditions due to the dynamic features. With the ability to adjust voltage level of each output of a corresponding equalizer circuit that is used to adjust an attenuated analog signal, the design described herein can be used to combat a drop or increase of supply voltages as well as any other process variation. It should be appreciated that this feature is useful to apply to analog or digital test inputs to avoid the need for input probing.

Figure 1:
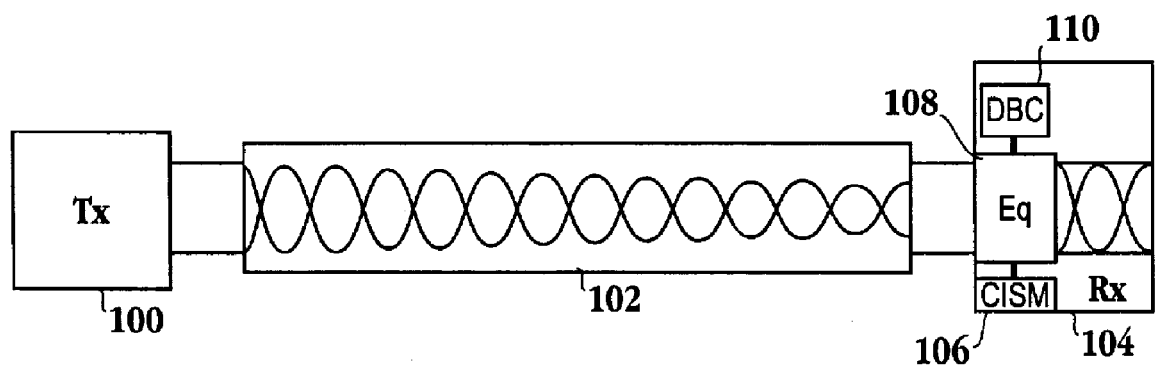
FIG. 1 is a simplified schematic diagram illustrating a signal being reshaped after traversing a back plane in accordance with one embodiment of the invention.

FIG. 1 is a simplified schematic diagram illustrating a signal being reshaped after traversing a back plane in accordance with one embodiment of the invention. Transmit module 100 will transmit a signal having a certain output shape to ultimately be received by receive module 104. The signal traverses back plane 102 and may become attenuated depending on the conditions, the length of the back plane, etc. Receive module reshapes the signal through equalizer 108. Equalizer 108 is operatively connected to dynamic bias circuit 110 and comparator/state machine 106. Through dynamic bias circuit 110, the signal received by receive module 104 is reshaped so that the output is amplified in order to compensate for losses during transmission through back plane 102. As will be described in more detail below, dynamic bias circuit 110 outputs a number of signals to the control knobs of equalizer 108 in order to adjust and reshape the signal. Dynamic bias circuit 110 incorporates a single digital to analog block rather than having a digital analog block dedicated to each control knob of equalizer 108. That is, the single digital-to-analog block is shared among the knobs of the equalizer.

In one embodiment, the digital-to-analog block is separate from the remainder of the circuitry making up dynamic bias circuit 110 of FIG. 1, i.e., the digital to analog block not integrated within the dynamic bias circuit. It should be appreciated that in this embodiment, where the digital-to-analog converter is not integrated into the dynamic bias circuit, all the remaining circuitry of the dynamic bias circuit can be constructed within an intellectual property (IP) core of an integrated circuit and the digital to analog converter can be located external to the IP core. Dynamic bias circuit 110 includes a number of n-bit registers chained together where each of the register chains may be referred to as a register frame. Each register frame is associated with a corresponding control knob of the equalizer and the register frames are chained together so that one single digital-to-analog converter is used to maintain the analog level of all the control knobs. In addition, it should be appreciated that the embodiments described herein eliminate the use of a manual bypass multiplexer in every equalizer control knob.

Figure 2:
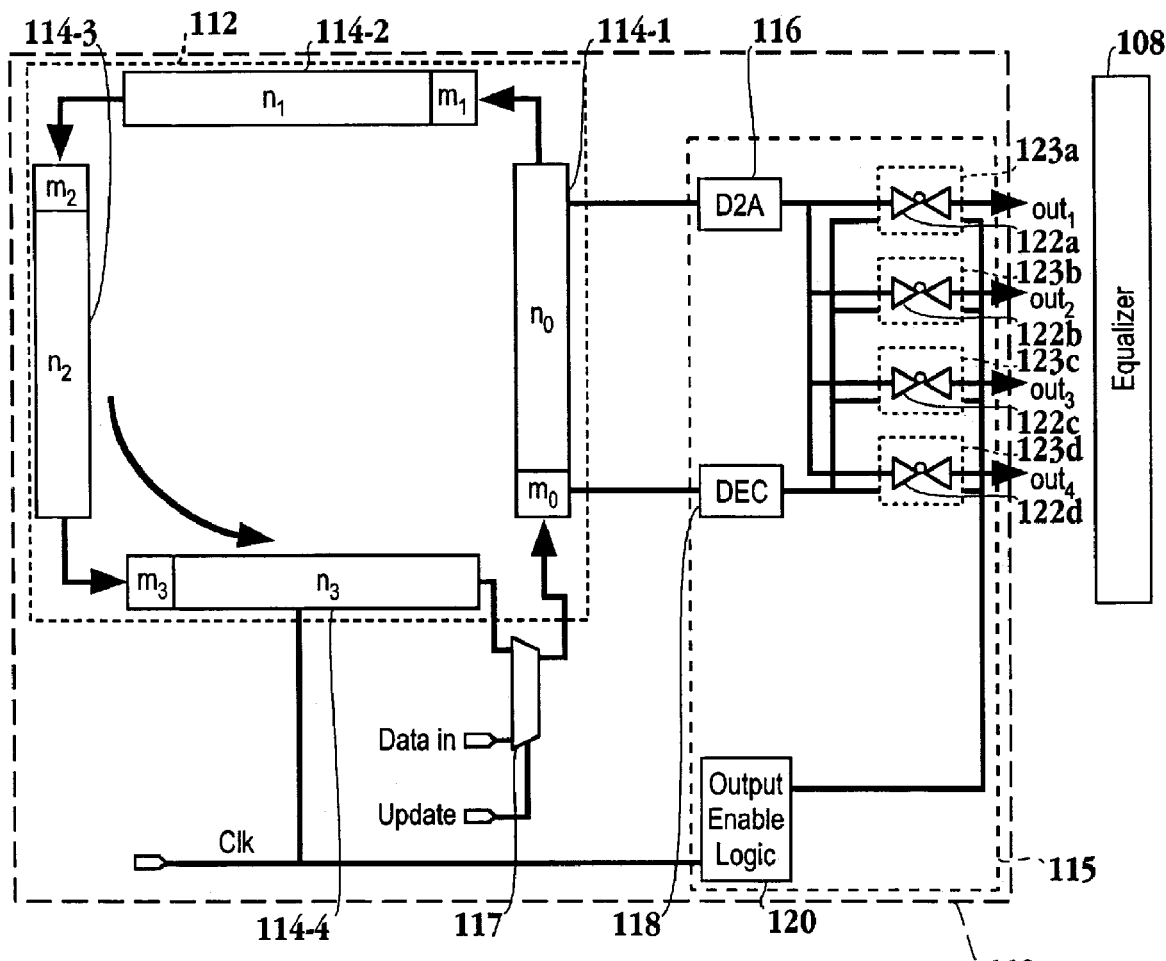
FIG. 2 is a more detailed diagram illustrating the components of the dynamic bias circuit in accordance with one embodiment of the invention.

FIG. 2 is a more detailed diagram illustrating the components of the dynamic bias circuit in accordance with one embodiment of the invention. Dynamic bias circuit 110 includes register chain 112 and equalization control circuitry 115. Register chain 112 may include any number of register chains, however, for illustrative purposes, register chain 112 is shown having four register chains in FIG. 2. Each register chain 114-1 through 114-4 includes a portion represented by m-bits and another portion represented by n-bits. The number of m-bits is associated with the number of knobs on equalizer 108 that can be connected to the outputs from the dynamic bias circuit 110. Thus, where equalizer 108 includes four knobs to be controlled, m will be 2 bits, i.e., $2^2$. Where equalizer 108 includes eight control knobs, m will be 3 bits, i.e., $2^3$, and so on. In addition, depending on the granularity of control desired for adjusting the analog signal, the number of bits represented by n impacts this degree of granularity. For example, if the range of adjustment is desired to be subdivided into 256 steps, the number of bits represented by n is 8, i.e., 28 equals 256. Thus, the voltage range, which may be represented by 0-1.2 volts in one exemplary embodiment, may be subdivided into 256 steps or sub-units. It should be noted that the specific examples provided herein for the size of the bit sequences are shown for exemplary purposes only and are not meant to be limiting.

Continuing with FIG. 2, equalization control circuitry 115 includes decoder 118, output enable logic module 120, and output ports 123a through 123d. Output ports 123a-d include respective transmission gates 122a-d as well as other output port gate circuitry specified in more detail with reference to FIG. 3. In addition, equalization control circuitry 115 illustrates digital-to-analog converter 116, however, as mentioned previously, digital-to-analog controller 116 may be placed outside of the IP core from the remainder of the circuitry for dynamic bias circuit 110. Multiplexor 117 is used to initially populate register chains 114-1 through 114-4, as well as update the register chains once the register chains are populated. As used herein, register chains 114-1 through 114-4 may be referred to as register frames. Update signal to multiplexor 117 selects between shifting the frame data from register frame 114-4 into primary register 114-1, or externally supplied updates. In one embodiment, the externally supplied updates may originate from a read only memory (ROM). Thus, as opposed to prior art bias circuits, register chain 112 is dynamic, in the sense that the values provided to the digital-to-analog converter 116 can be changed through time domain multiplexing. Digital-to-analog converter 116 is operatively coupled with primary register 114-1. As illustrated, a portion of the entire bit sequence, i.e., no, is provided to digital to analog converter 116. The number of bits or the bit sequence in primary register 114-1 will correlate to a certain output for digital-to-analog converter 116, which is then communicated to each of output ports 123a-d and corresponding input ports 122a-d, to eventually be applied to respective control knobs of equalizer 108.

Still referring to FIG. 2, during each clock cycle, the data within the data chain represented by register frames 114-1 through 114-4 are shifted. Thus, during successive clock cycles, the bits within each storage element of chain 112 would rotate in a counterclockwise manner so that the contents of register frame 114-4 are eventually moved into register frame 114-1. Ultimately a new bit sequence is provided to digital-to-analog converter 116 resulting in a different signal being output from digital-to-analog converter 116. Output enable logic module 120 is tied to the same clock signal as register chain 112 and tracks the clock cycles, e.g., through a counter, in order to determine when an enable period has been completed, i.e., all of the bits from frame register 114-4 have been shifted into register frame 114-1 so that register frame 114-1 has a complete bit sequence. In response to determining that the enable period has been completed and register frame 114-1 has a complete bit sequence, output enable logic module 120 asserts an enable signal to each of output ports 123a-d.

Continuing with FIG. 2, each register frame 114-1 through 114-4 includes a bit sequence having a portion represented by n bits and a portion represented by m bits. The bit sequence associated with no is provided as the input to digital to analog converter 116, while the bit sequence for $m_0$ is provided to decoder 118. Decoder 118 is used to select one of output ports 123a-d that will be used to output the data to a corresponding control knob of equalizer 108. In other words, decoder 118 selects which knob of equalizer 108 is being adjusted. Output enable logic block 120 generates the enable signal, which is gated with the output of decoder 118, as discussed in more detail with reference to FIG. 3. In one embodiment, the number of frame registers may periodically repeat with the same information in order to more finely tune the output from equalizer 108. That is, the output from frame register 114-1 and 114-3 may be the same output. Consequently, the same control knobs would be selected through decoder 118 to adjust the corresponding control knob every second cycle rather than every fourth cycle. One skilled in the art will appreciate that numerous combinations and configurations for the bit sequences within the register chain 112 can accommodate any number of desired sequences.

Figure 3:
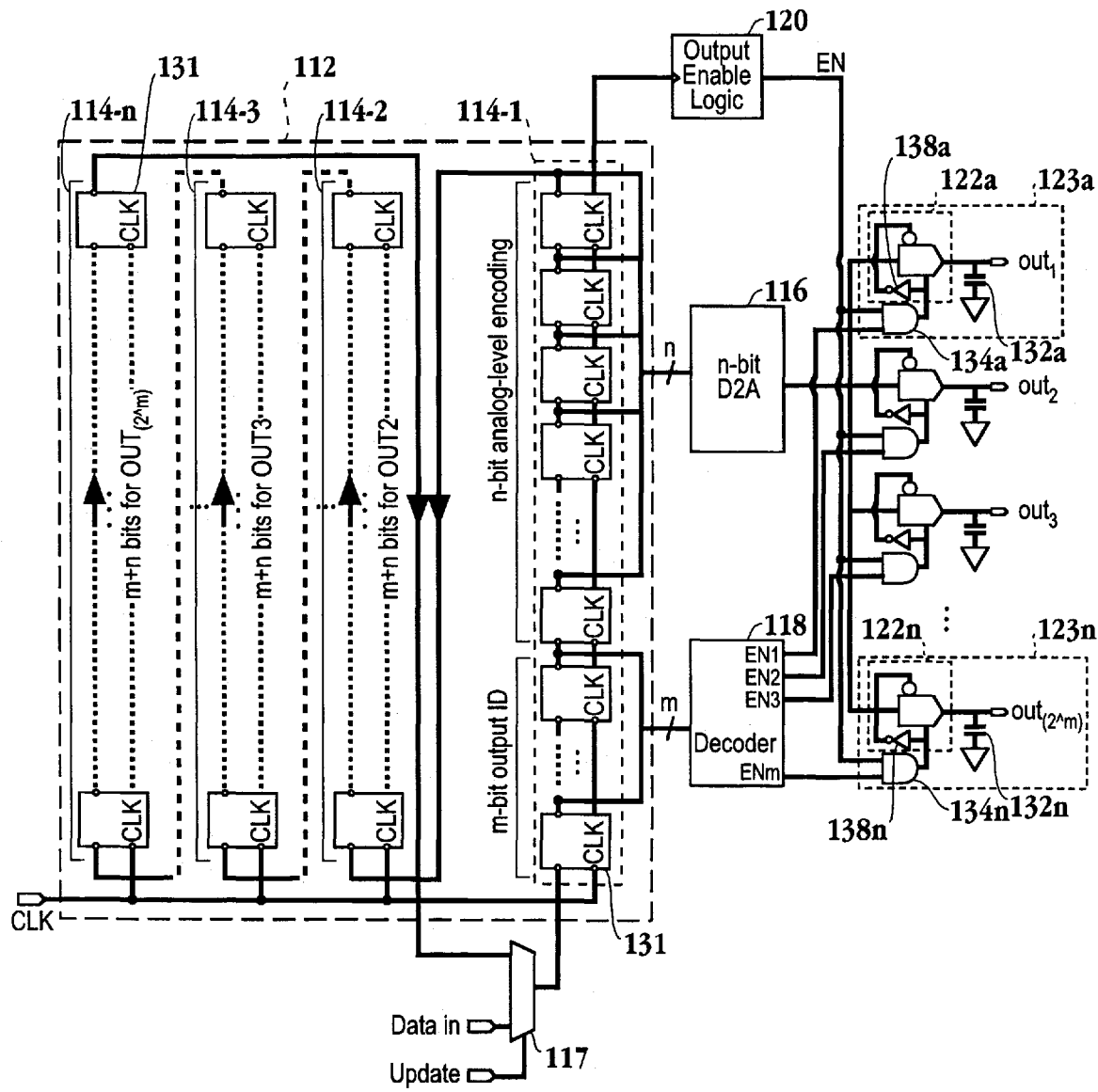
FIG. 3 is a simplified schematic diagram showing an alternative embodiment of the dynamic bias circuit illustrated in FIG. 2.

FIG. 3 is a simplified schematic diagram showing an alternative embodiment of the dynamic bias circuit illustrated in FIG. 2. Register chain 112 is illustrated in column form rather than a logical form of a geometric shape, as illustrated in FIG. 2. As shown in FIG. 3, primary register 114-1 includes a number of storage elements used to store the corresponding number of m-bits and n-bits. One skilled in the art will appreciate that the storage elements may be any suitable storage element, e.g., flip-flops, latches, etc. In the previous example discussed with reference to FIG. 2, to control four knobs on equalizer 108, two registers would be used in the m-bit portion of the primary register 114-1, while eight registers would be used in the corresponding n-bit portion of the primary register to provide 256 adjustment points over the range of adjustment for each control knob of the equalizer. Returning to FIG. 3, according to the bit sequence in the analog level encoding portion of primary register 114-1, the digital-to-analog converter 116 outputs a voltage level to the plurality of transmission gates 122*a-n* within output ports 123*a-n*, in order to provide the output to be received by a corresponding knob on the equalizer. According to the m-bit sequence, decoder 118 will select one of transmission gates 112*a*-122*n* corresponding to a respective knob on the equalizer. In addition, output enable logic 120 will assert an enable signal enabling the corresponding transmission gate.

Further detail is provided for each of output ports 123*a-d* and transmission gates 122*a* through 122*d* of FIG. 2 in FIG. 3. Output port 123*a* includes transmission gate 122*a*, AND gate 134*a*, inverter 138*a* and capacitor 132*a*. Capacitor 132*a* is used to hold the voltage level signal to be provided to corresponding equalizer knob and to refresh the value held within transmission gate 122*a*. As illustrated in FIGS. 2 and 3, a number of m+n serially chained registers, which each may be referred to as a single data frame, is needed for each analog output. Each data chain consists of two groups: n-bit analog level encoding bits and m-bit output identification bits. A corresponding larger n number is required to employ higher resolution digital-to-analog converter. The number m bits is chosen to sufficiently identify a maximum number of $2^m$ outputs. Output enable logic block 120 is designed to issue pulse data, i.e., enable signals, typically no more than one clock period. The period of the enable signals is m+n times the clock period and may be tracked by the output enable logic through counters or some other suitable circuitry for tracking the clock cycles. In one embodiment, the enable signal is disabled before one frame of data (m+n bits) that specifically belong to one output, begins to shift out of the primary register in order to provide for a more stable output. As one frame of data, i.e., a complete bit sequence, is shifted entirely into primary register 114-1, the enable signal is asserted through output enable logic module 120. Digital-to-analog converter 116 generates the analog level and output decoder 118 allows the refresh of the output with the correct identification. As illustrated in FIG. 3, each output port 123*a-n* has a corresponding capacitor 132*a-n* used to maintain and at the same time, stabilize the signal output. As other data frames alternatively cycle through, the time domain multiplexing described herein enables many outputs to stay at different analog levels.

Still referring to FIG. 3, data input multiplexor 117, through the update control, allows programming content of all output data to be shifted in from the DATAIN input or circulate around the entire data chain to dynamically refresh all outputs. New programming content can be updated by exercising, i.e., asserting, the update signal without disrupting the refresh cycle through the output. Accordingly, fine-tuned adjustments are possible. In one embodiment, to reduce the number of registers 131 used in serial chain 112, the update signal is asserted and data is supplied from an intelligent host/tester or the core's random access memory (RAM) or read-only memories (ROM). In one embodiment, the output identification allows certain output to be refreshed at a higher rate than others if necessary. This means allowing more frames to the same output in one large cycle. As described above, the bit sequence for multiple frames may be the same to achieve the higher rate of refreshing. In another embodiment, a faster clock can be selected for more leaky charge storage elements at the output. Thus, the design is process scalable.

Alternatively, the bias circuit described above can be used to test leaky processes, i.e., metal capacitors. One skilled in the art will appreciate that if the timing domain multiplexing is suppressed, i.e., stopping the clock signal at enable active, a passive bias circuit is provided having one analog output with fine adjusting capability. One skilled in the art will appreciate that numerous configurations are possible with the structure of the data frames and the bit sequences stored therein.

Figure 4A:
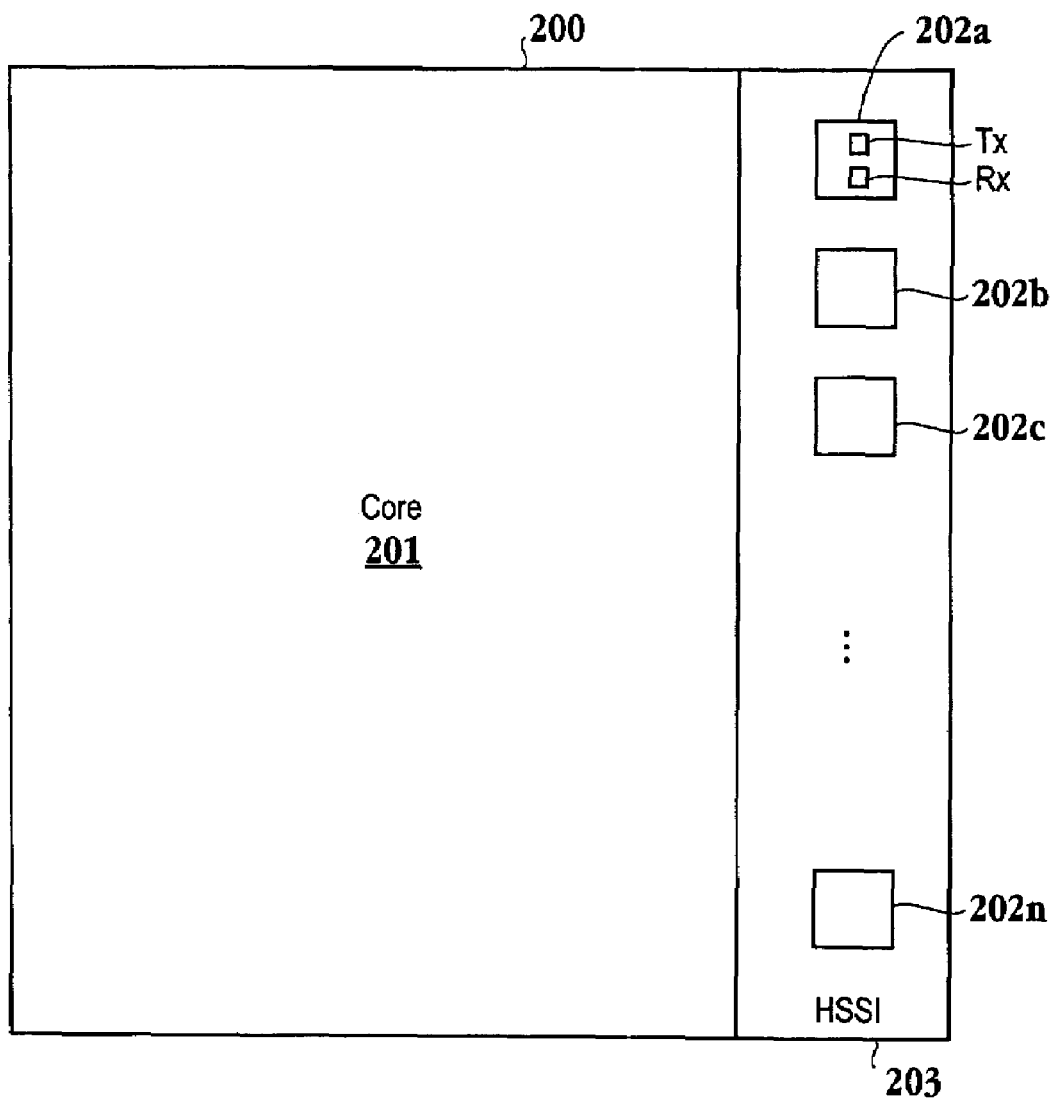
FIG. 4A is a high-level schematic diagram of a particular use of the bias circuit in accordance with one embodiment of the invention.

FIG. 4A is a high-level schematic diagram of a particular use of the bias circuit in accordance with one embodiment of the invention. Programmable logic device 200 includes core 201 and high-speed serial interface 203. It should be appreciated that core 201 may be structured as the architecture for any integrated circuit, including the architecture of a field programmable gate array (FPGA), such as the STRATIX™ family of FPGA's owned by the assignee. High-speed serial interface 203 includes a number of serial deserializer channels 202*a* through 202*n*. Each serializer deserializer channel includes a transmit and a receive port.

Figure 4B:
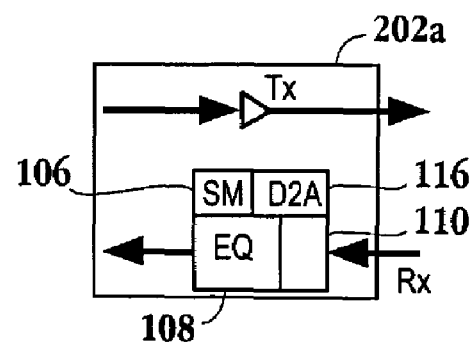
FIG. 4B shows a more detailed diagram of a particular serializer deserializer channel of FIG. 4A.

FIG. 4B shows a more detailed diagram of a particular serializer deserializer channel of FIG. 4A. On the receive side of the serializer deserializer channel 202*a*, the dynamic bias circuit is incorporated therein. Thus, dynamic bias circuit 110 is provided along with equalizer 108, digital-to-analog converter 116, and state machine 106. Thus, any signal coming into programmable logic device 200, which has been attenuated due to any circumstances, can be reshaped in order to provide programmable logic device 200 with an accurate signal.

Figure 5:
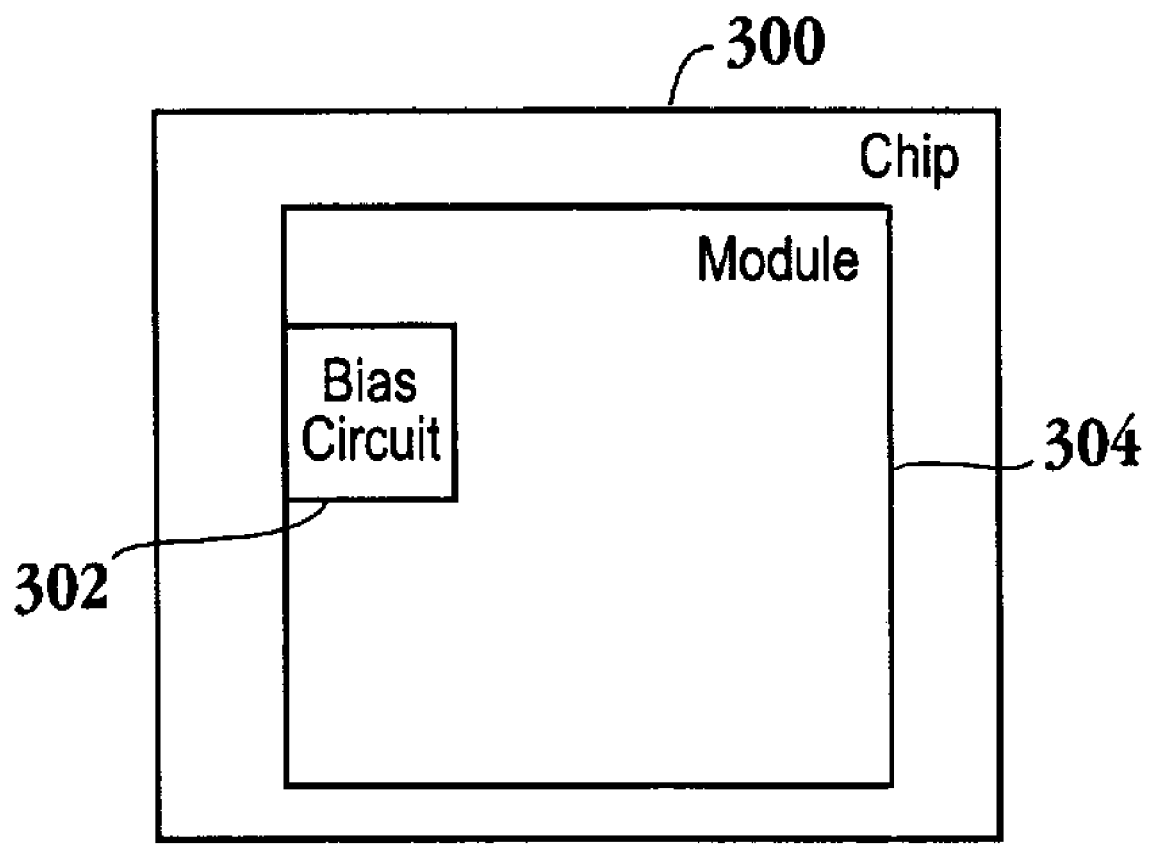
FIG. 5 is a high-level schematic diagram illustrating the dynamic bias circuit for use within any semiconductor chip.

FIG. 5 is a high-level schematic diagram illustrating the dynamic bias circuit for use within any semiconductor chip. Semiconductor chip 300 may include any sub-chip 304 or any other module in which an analog signal is provided to the sub chip or module. Bias circuit 302 can be used to adjust or reshape the signal being provided to sub-chip 304 in order to provide for an accurate input into sub-chip 304. Thus, bias circuit 304 would include the register chain and the equalization control circuitry illustrated with reference to FIGS. 2 and 3. Of course not all the functionality need be contained within bias circuit 302. As mentioned above, the digital to analog converter may be located in a non-core area of semiconductor chip 304 while the remainder of the bias circuit is defined in an IP core of the semiconductor chip.

Figure 6:
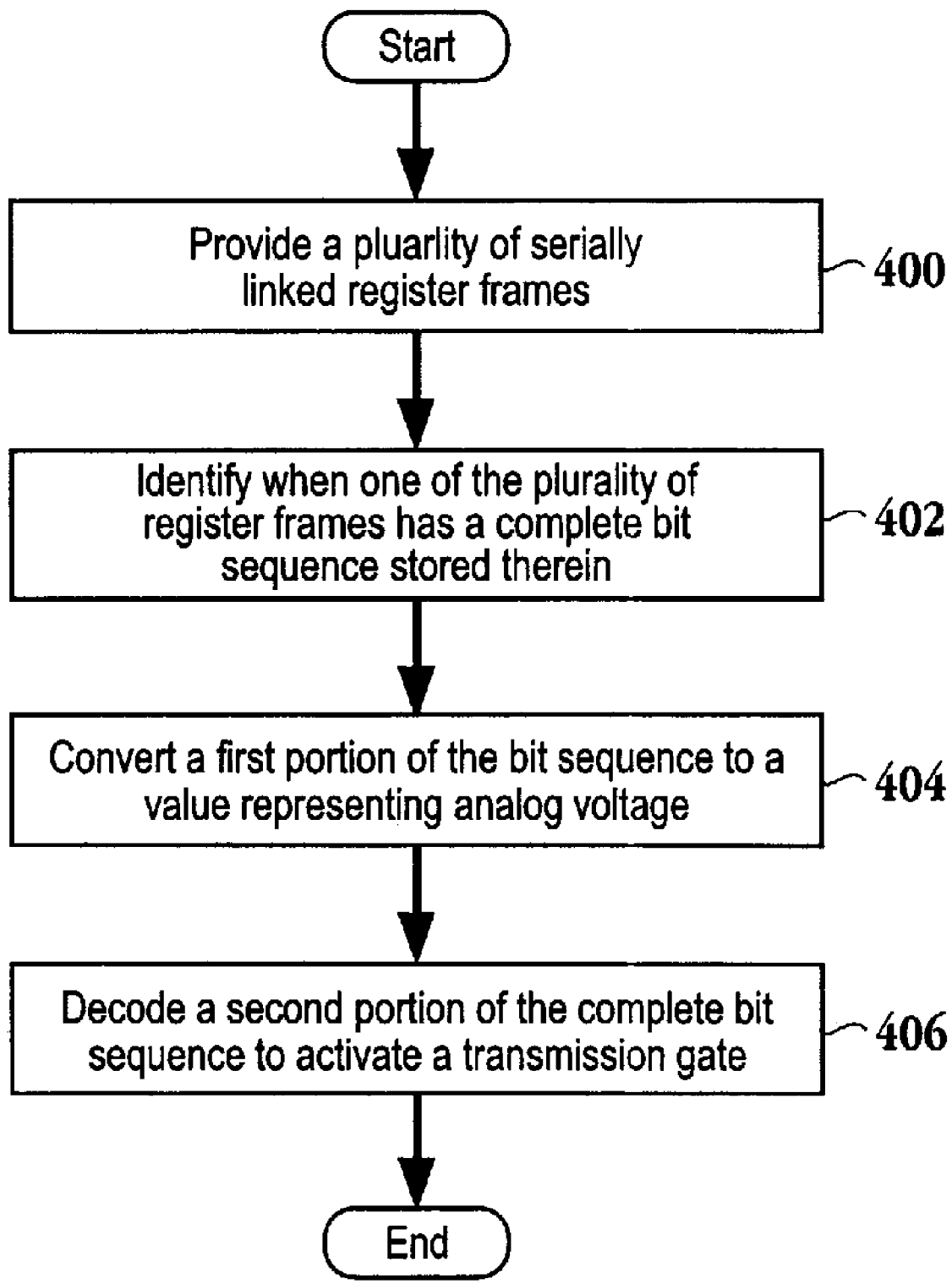
FIG. 6 is a flow chart diagram illustrating the method operations for adjusting multiple control knobs of an equalization circuit through a single digital analog converter in accordance with one embodiment of the invention.

FIG. 6 is a flow chart diagram illustrating the method operations for adjusting multiple control knobs of an equalization circuit through a single digital analog converter in accordance with one embodiment of the invention. The method initiates with operation 400 where a plurality of register frames serially linked to form a data chain are provided. Each of the plurality of register frames is capable of storing a bit sequence therein. As illustrated in FIGS. 2 and 3, the plurality of register frames are serially linked in order to execute the time domain-multiplexing scheme discussed herein. The method advances to operation 402 where it is identified when one of the plurality of register frames has a complete bit sequence stored therein. As discussed above, the data within the data chain is shifted on each clock cycle and as the data from one frame is completely moved into another frame, the output enable logic module will identify the completion of this movement. In one embodiment, if there are m+n bits in each register frame and the bits are shifted one position each clock cycle, then a complete frame will occur each m+n clock cycles. Accordingly, as mentioned above, the output enable logic module will assert an enable signal when a complete bit sequence has been shifted into one of the register frames.

The method of FIG. 6 then proceeds to operation 404 where a first portion of the complete bit sequence is converted to a value representing an analog voltage. Here, the n corresponding bit are provide to a digital-to-analog converter and this bit sequence is used to establish an output from the digital-to-analog converter that will be used to adjust a signal received by an equalization circuit. The resolution provided by the digital-to-analog circuit will be proportional to the number of bits in the first portion bit sequence. The method then moves to operation 406 where a second portion of the complete bit sequence is decoded to activate a transmission gate corresponding to one of the multiple control knobs. The second portion here refers to the m number of bits, which is provided to a decoder in order to identify the transmission gate for the respective output port. In one embodiment, the decoder output and the output from the output enable logic module are gated as illustrated with reference to FIG. 3, in order to select the appropriate transmission gate to deliver the output voltage to the desired control knob of an equalization circuit.

In summary, the above-described invention provides a dynamic bias circuit and a method for applying time domain multiplexing to share a single digital to analog converter among multiple output ports. The embodiments provide a bias circuit having an n-bit digital to analog converter that provides one analog output with $2^n$ resolution between two reference voltage levels. Through the digital to analog converter, X outputs are provided, where X is an integer that is greater than or equal to 2, instead of using one digital to analog converter for each output. The use of a single digital to analog converter is achieved in combination with serially linked register frames having n bits for the digital to analog converter and m bits sufficiently large enough to identify each of the X outputs. One skilled in the art will appreciate that the bias circuit described above may be utilized to adapt to changing environmental conditions by updating the register frames through the DATAIN pathway. Thus, changing conditions including temperature, pressure, supply conditions, etc., can all be adjusted and the bias circuit is not locked into a setting once that setting is established.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A bias circuit for adjusting a signal, comprising:
a plurality of serially linked register frames providing an output that is distributed among a plurality of transmission gates for determining a voltage level for adjusting an analog signal, wherein data stored within the plurality of serially linked register frames is periodically shifted thereby changing the output through time domain multiplexing,
a multiplexer enabling input into one of the plurality of serially linked register frames; and
output enable logic module determining a completion of shifting the data stored within the plurality of serially linked register frames to generate an enable signal for the plurality of transmission gates.

2. The bias circuit of claim 1, further comprising:
a decoder for selecting one of the plurality of transmission gates to provide corresponding output to an external circuit; and
a digital to analog converter receiving the output from the plurality of serially linked register frames and distributing the output to the plurality of transmission gates.

3. The bias circuit of claim 2, wherein each of the plurality of register frames includes a first bit sequence portion and a second bit sequence portion, the first bit sequence portion provides the input to the digital to analog converter, the second bit sequence portion provides input to the decoder for selecting one of the plurality of transmission gates.

4. The bias circuit of claim 2, wherein the external circuit is an equalizer.

5. The bias circuit of claim 1, wherein the one of the plurality of serially linked register frames defines a resolution level between two reference voltage levels.

6. The bias circuit of claim 5, wherein the multiplexer enables external data to be input into the one of the plurality of register frames.

7. A bias circuit for providing signals for an equalization circuit, comprising:
a plurality of register frames forming a data chain, a primary register frame of the plurality of register frames defining a resolution level between two reference voltage levels, wherein the plurality of register frames are serially linked and data within the data chain is shifted among the plurality of register frames to periodically change the resolution level.

8. The bias circuit of claim 7, further comprising:
a decoder coupled to the primary register frame, the decoder activating a data path corresponding to one of a plurality of control knobs of the equalization circuit.

9. The bias circuit of claim 8, wherein a portion of a bit sequence within the primary register frame is input into a digital to analog converter to generate an output representing a voltage level for tuning an analog signal and a remainder of the bit sequence is input into the decoder.

10. The bias circuit of claim 8, further comprising:
an output enable logic module, the output enable logic module determining when a complete frame of data has been shifted into the primary register frame.

11. The bias circuit of claim 10, further comprising:
a plurality of output ports, each of the plurality of output ports having a transmission gate receiving output from a digital to analog convener and each transmission gate is gated with inputs received from the decoder and the output enable logic module.

12. The bias circuit of claim 7, further comprising:
a multiplexer inserted within the data chain prior to the primary register, the multiplexer enabling external data to be written into the primary register frame.

13. A method for adjusting multiple control knobs of an equalization circuit, comprising method operations of:
shifting in data to fill a plurality of register frames serially linked to form a data chain;
converting a first portion of a bit sequence within one of the plurality of register frames to a value representing an analog voltage; and
decoding a second portion of the bit sequence to activate a pass gate corresponding to one of the multiple control knobs.

14. The method of claim 13, further comprising:
triggering an enable signal to a plurality of pass gates corresponding to the multiple control knobs after shifting in the data.

15. The method of claim 14, wherein the method operation of decoding a second portion of the complete bit sequence to activate a pass gate corresponding to one of the multiple control knobs includes,
gating a signal representing the decoded second port ion of the complete bit sequence with the enable signal.

16. The method of claim 13, further comprising:
shifting bits within the data chain at each successive clock period;
identifying when a primary register frame of the plurality of register frames has a next bit sequence; and
repeating the converting and decoding for the next bit sequence.

17. The method of claim 13, wherein the first portion of bits represents a resolution of an output of a digital to analog converter.

18. The method of claim 13, further comprising:
selecting external data to be written into the data chain.

19. The method of claim 13, wherein the bit sequence within the one of the plurality of register frames is repeated within another of the plurality of register frames.

* * * * *